(12) United States Patent
Yang

(10) Patent No.: US 10,289,231 B2
(45) Date of Patent: May 14, 2019

(54) LTPS ARRAY SUBSTRATE AND METHOD FOR MANUFACTURING THE SAME

(71) Applicant: WUHAN CHINA STAR OPTOELECTRONICS TECHNOLOGY CO., LTD., Wuhan,Hubei (CN)

(72) Inventor: Chengao Yang, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 37 days.

(21) Appl. No.: 15/569,315

(22) PCT Filed: Jun. 9, 2017

(86) PCT No.: PCT/CN2017/087784
§ 371 (c)(1),
(2) Date: Oct. 25, 2017

(87) PCT Pub. No.: WO2018/196111
PCT Pub. Date: Nov. 1, 2018

(65) Prior Publication Data
US 2018/0314374 A1 Nov. 1, 2018

(30) Foreign Application Priority Data
Apr. 26, 2017 (CN) .......................... 2017 1 0282190

(51) Int. Cl.
G06F 3/041 (2006.01)
G06F 3/047 (2006.01)
H01L 27/12 (2006.01)
H01L 29/417 (2006.01)
H01L 29/423 (2006.01)

(52) U.S. Cl.
CPC ............ G06F 3/0414 (2013.01); G06F 3/047 (2013.01); G06F 3/0412 (2013.01); G06F 3/0416 (2013.01); H01L 27/124 (2013.01); H01L 27/1262 (2013.01); H01L 29/41733 (2013.01); H01L 29/42384 (2013.01); G02F 2201/121 (2013.01); G02F 2201/123 (2013.01)

(58) Field of Classification Search
CPC ..... G06F 3/0412; G06F 3/0416; H01L 27/124
See application file for complete search history.

(56) References Cited

U.S. PATENT DOCUMENTS

| | | | | |
|---|---|---|---|---|
| 2011/0001723 | A1* | 1/2011 | Fan ........................ | G06F 3/0412 345/174 |
| 2017/0300160 | A1* | 10/2017 | Tsai ....................... | G06F 3/0412 |
| 2017/0308240 | A1* | 10/2017 | Yeh .......................... | G06F 3/044 |

* cited by examiner

Primary Examiner — Kevin M Nguyen
(74) Attorney, Agent, or Firm — Ladas & Parry LLP

(57) ABSTRACT

A low temperature poly-silicon (LTPS) array substrate is provided. The LTPS array substrate includes a substrate, a gate electrode insulating layer, an interlayer insulating layer, an organic layer, and a plurality of pressure sensitive plates that are stacked on one another. The pressure sensitive plates are formed on the organic layer. The LTPS array substrate further includes a metal layer formed on the organic layer, and the metal layer has a pattern of a plurality of common electrodes and a plurality of pressure sensitive lines that are insulated from each other. The pressure sensitive lines are connected to the pressure sensitive plates.

16 Claims, 4 Drawing Sheets

LTPS ARRAY SUBSTRATE AND METHOD FOR MANUFACTURING THE SAME

FIELD OF THE DISCLOSURE

The present disclosure relates to the field of liquid crystal displaying techniques, and more particularly to a low temperature poly-silicon (LTPS) array substrate and a method for manufacturing the same.

BACKGROUND

Traditional non-smart cellphones have been replaced with the emergence of smart cellphones. Additionally, screen sizes of the cellphones are increasing. Operation of the cellphones has also changed from a traditional push-button mode to a touch pressure control mode. Thereafter, touch pressure control techniques are rapidly developing.

Touch pressure control is carried out by pressing a touch control panel of a cellphone or tablet computer. With surface of the touch control panel being deformed, pressure can be detected by a pressure sensor to achieve sensing of touch pressure. Conventional touch control screens generally employ a so-called add-on type of the pressure sensors, where the pressure sensors are manufactured independently, and the pressure sensors are thereafter attached to the liquid crystal display panel, to achieve touch pressure sensitivity. However, the pressure sensors are far from the cover glass. This makes lower touch pressure sensitivity. Moreover, a new substrate has to be introduced into the process of producing the pressure sensors. Additional attaching times and additional metal lines and flexible circuit boards both increase manufacturing display panel costs. Also, after the pressure sensors are attached to the display panel, thickness and weight of the entire display module increases, which does not allow for thin thickness and light weight sought by the cellphone and mobile working. It is not the most satisfactory technical scheme for carrying out touch pressure control.

Thus, according to conventionally-used display panel with touch pressure control function, the pressure sensors are configured as an add-on type, the pressure sensors are far from the cover glass, and touch pressure sensitivity is low. Moreover, use of the add-on type of pressure sensors will increase both thickness and weight of the mobile apparatus. Accordingly, there is a need to provide an improved touch pressure control display panel.

SUMMARY OF THE DISCLOSURE

The present disclosure provides an LTPS array substrate, which integrates the pressure sensors within the panel so as to solve the problems encountered by the conventionally-used add-on type of touch pressure control display panel, including that add-on type of pressure sensors are far from the cover glass, sensitivity of touch pressure is low, and use of the add-on type of pressure sensors will increase both thickness and weight of the mobile apparatus.

To solve the above-said problems, the present disclosure provides plural technical schemes as described below.

The present disclosure provides a low temperature poly-silicon (LTPS) array substrate, comprising:
a substrate;
a gate electrode insulating layer formed on a surface of the substrate;
an interlayer insulating layer formed on a surface of the gate electrode insulating layer;
an organic layer formed on a surface of the interlayer insulating layer;
a plurality of pressure sensitive plates formed in the organic layer, wherein the pressure sensitive plates are made of a piezoelectric material; and
a metal layer formed on the organic layer,
wherein the metal layer has a pattern of a plurality of common electrodes and a plurality of pressure sensing lines that are insulated from each other, and the pressure sensing lines are connected to the pressure sensitive plates;
wherein a plurality of notches are formed at one side of each of the common electrodes, one pressure sensing point is formed in each of the notches, and the pressure sensing points at the same row are connected to a same pressure sensing line.

In accordance with a preferred embodiment of the present disclosure, the metal layer comprises the common electrodes that are distributed separately, one of the pressure sensing lines is disposed between two adjacent common electrodes, and the pressure sensing lines are connected to a same signal line at one end thereof.

In accordance with a preferred embodiment of the present disclosure, a dielectric layer is formed on a surface of the organic layer, and a plurality of touch control through-holes are formed on the dielectric layer.

In accordance with a preferred embodiment of the present disclosure, a plurality of planar touch control signal lines are formed on a surface of the dielectric layer, and the planar touch control signal lines are connected to the common electrodes via the touch control through-holes.

In accordance with a preferred embodiment of the present disclosure, the organic layer comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates are connected to the pressure sensing lines via the pressure sensitive through-holes.

In accordance with a preferred embodiment of the present disclosure, the pressure sensitive plates are formed on a surface of the organic layer, the pressure sensing lines are formed on a surface of the pressure sensitive plates, and the pressure sensing lines are connected to the pressure sensitive plates by contacting therewith.

In accordance with a preferred embodiment of the present disclosure, both the common electrodes and the pressure sensing lines are a transparent metal electrode.

The present disclosure further provides another low temperature poly-silicon (LTPS) array substrate, comprising:
a substrate;
a gate electrode insulating layer formed on a surface of the substrate;
an interlayer insulating layer formed on a surface of the gate electrode insulating layer;
an organic layer formed on a surface of the interlayer insulating layer;
a plurality of pressure sensitive plates formed in the organic layer, wherein the pressure sensitive plates are made of a piezoelectric material; and
a metal layer formed on the organic layer,
wherein the metal layer has a pattern of a plurality of common electrodes and a plurality of pressure sensing lines that are insulated from each other, and the pressure sensing lines are connected to the pressure sensitive plates.

In accordance with a preferred embodiment of the present disclosure, the metal layer comprises the common electrodes that are distributed separately, one of the pressure sensing lines is disposed between two adjacent common electrodes, and the pressure sensing lines are connected to a same signal line at one end thereof.

In accordance with a preferred embodiment of the present disclosure, a dielectric layer is formed on a surface of the organic layer, and a plurality of touch control through-holes are formed on the dielectric layer.

In accordance with a preferred embodiment of the present disclosure, a plurality of planar touch control signal lines are formed on a surface of the dielectric layer, and the planar touch control signal lines are connected to the common electrodes via the touch control through-holes.

In accordance with a preferred embodiment of the present disclosure, the organic layer comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates are connected to the pressure sensing lines via the pressure sensitive through-holes.

In accordance with a preferred embodiment of the present disclosure, the pressure sensitive plates are formed on a surface of the organic layer, the pressure sensing lines are formed on a surface of the pressure sensitive plates, and the pressure sensing lines are connected to the pressure sensitive plates by contacting therewith.

In accordance with a preferred embodiment of the present disclosure, both the common electrodes and the pressure sensing lines are a transparent metal electrode.

The present disclosure further provides a method for manufacturing a low temperature poly-silicon (LTPS) array substrate, comprising:

providing a substrate;

forming a buffer layer on the substrate;

forming a channel for each of a plurality of TFTs;

forming a gate electrode insulating layer, a plurality of gate electrodes, and a plurality of scan lines on the substrate, wherein each of the gate electrodes is correspondingly connected to one of the scan lines;

forming an interlayer insulating layer on the substrate, and forming a plurality of source electrode through-holes and a plurality of drain electrode through-holes on the interlayer insulating layer;

depositing a first metal layer on the substrate, and patterning the first metal layer to form a plurality of source electrodes of the TFTs, a plurality of drain electrodes of the TFTs, and a plurality of data lines on the interlayer insulating layer; wherein each of the source electrodes is connected to one side of one of the channels via one of the source electrode through-holes, and each of the drain electrodes is connected to the other side of one of the channels via one of the drain electrode through-holes; wherein each of the source electrodes of the TFTs is correspondingly connected to one of the data lines;

forming an organic layer on the substrate, and forming a plurality of pressure sensitive plates in the organic layer, and then forming a plurality of pressure sensitive through-holes on the organic layer;

depositing a second metal layer on the substrate, and patterning the second metal layer to form a plurality of common electrodes and a plurality of pressure sensing lines that are insulated from each other on the organic layer; wherein the pressure sensing lines are connected to the pressure sensitive plates via the pressure sensitive through-holes;

forming a dielectric layer and a plurality planar touch control signal lines on the substrate, and forming a plurality of touch control through-holes on the dielectric layer; wherein the planar touch control signal lines are connected to the common electrodes via the touch control through-holes; and forming a passivation layer and a plurality of pixel electrodes on the substrate, and forming a plurality of pixel electrode through-holes on the passivation layer, the dielectric layer, and the organic layer; wherein the pixel electrodes are connected to the drain electrodes via the pixel electrode through-holes.

In accordance with a preferred embodiment of the present disclosure, forming an organic layer on the substrate, and forming a plurality of pressure sensitive plates in the organic layer, and then forming a plurality of pressure sensitive through-holes on the organic layer comprises:

forming a first planarization layer on the substrate, and forming the pressure sensitive plates on the first planarization layer;

forming a second planarization layer on the substrate, and forming the pressure sensitive through-holes on the second planarization layer.

Compared to conventionally-used display panel with touch pressure control function, the present disclosure provides an LTPS array substrate, where the pressure sensors are formed in the layered structure of the LTPS array substrate. This makes the distance between the pressure sensors and the cover glass smaller, which further not only raises sensitivity of touch pressure but reduces thickness of the display module. Additionally, according to present disclosure, the integrated pressure sensors can be formed in consistency with and compatibly with current manufacturing process. This would not require extra steps for manufacturing the panel. The problems encountered in the conventional touch pressure control display panel, including that add-on type of pressure sensors are far from the cover glass, sensitivity of touch pressure is low, and use of the add-on type of pressure sensors will increase both thickness and weight of the mobile apparatus, can be solved.

BRIEF DESCRIPTION OF THE DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
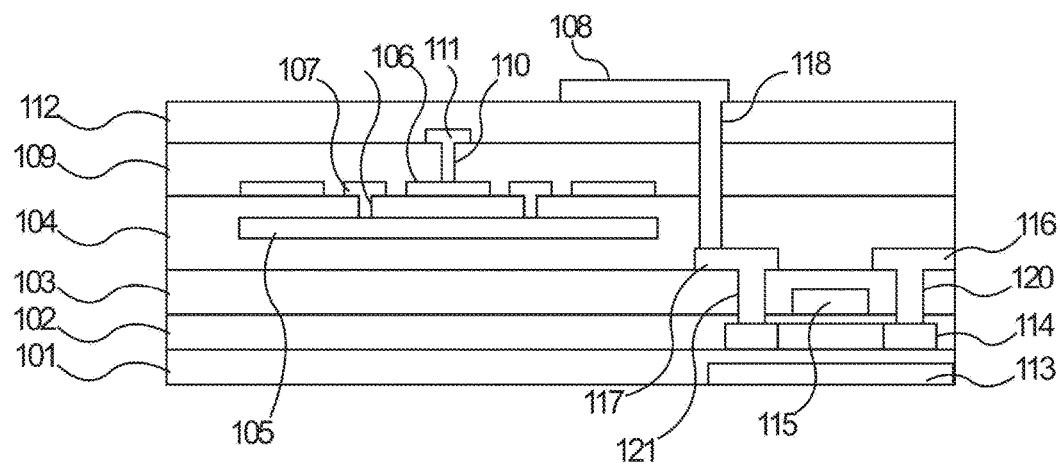
FIG. 1 shows a cross-sectional view of an LTPS array substrate according to an embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. Devices having similar structures in the drawings are represented by the same reference numeral.

Conventionally-used add-on type of pressure sensors are far from the cover glass, touch pressure sensitivity is low, and use of the add-on type of pressure sensors will increase both thickness and weight of the mobile apparatus. The present disclosure can solve such problems.

Please refer to FIG. 1 which shows a cross-sectional view of an LTPS array substrate according to an embodiment of the present disclosure.

As shown in FIG. 1, the present disclosure provides an LTPS array substrate, including: a substrate 101; a gate electrode insulating layer 102 formed on a surface of the substrate 101; an interlayer insulating layer 103 formed on a surface of the gate electrode insulating layer 102; an organic layer 104 formed on a surface of the interlayer insulating layer 103; a plurality of pressure sensitive plates 105 formed in the organic layer 104, where the pressure sensitive plates 105 are made of a piezoelectric material; and a metal layer formed on the organic layer 104. The metal layer is patterned to form a plurality of common electrodes 106 and a plurality of pressure sensing lines 107 that are insulated from each other. The pressure sensing lines 107 are connected to the pressure sensitive plates 105.

In the process for manufacturing a conventional LTPS array substrate, the metal layer is patterned for forming a plurality of common electrodes 106, so that a plurality of storage capacitors can be generated between the common electrodes 106 and the pixel electrodes 108. According to the present disclosure, the present disclosure merely replaces the photomask used in this patterning step with another one having different pattern disposed thereon. The present disclosure does not use additional photomasks to form additional conductive lines in the LTPS array substrate. Therefore, according to the present disclosure, the steps for manufacturing the LTPS array substrate are the same as the prior art, and there is no need to incur extra cost for modifying the steps.

A dielectric layer 109 is formed on a surface of the organic layer 104. The dielectric layer 109 can be made of a dielectric material such as silicon nitride or silicon oxide. A plurality of touch control through-holes 110 are formed on the dielectric layer 109. A plurality of planar touch control signal lines 111 are formed on a surface of the dielectric layer 109. A passivation layer 112 is further formed on the surface of the dielectric layer 109. A plurality of pixel electrodes 108 are formed on a surface of the passivation layer 112.

The planar touch control signal lines 111 are connected to the common electrodes 106 via the touch control through-holes 110. The common electrodes 106 and the planar touch control signal lines 111 constitute a planar touch control panel. Once a finger touches the panel, variation of capacitance of the common electrode 106 can be detected to locate the touched point so as to achieve planar touch pressure control. Also, a plurality of storage capacitors are formed between the common electrodes 106 and the pixel electrodes 108, therefore implementation of pre-charge of the display pixels may be accomplished.

In particular, a light-shielding layer 113 is formed in the substrate 101. A polycrystalline silicon layer 114 is formed on the surface of the substrate 101, where the polycrystalline silicon layer 114 is configured to form a plurality of channel areas as well as a plurality of source electrode doping areas and a plurality of drain electrode doping areas disposed at two sides of each of the channel areas. The gate electrode insulating layer 102 is formed on the surface of the substrate 101. A plurality of gate electrodes 115 and the interlayer insulating layer 103 are formed on the surface of the gate electrode insulating layer 102. A plurality of source electrodes 116 and a plurality of drain electrodes 117 are formed on the surface of the interlayer insulating layer 103. The source electrodes 116 are connected to the source electrode doping areas via a plurality of source electrode through-holes 120. The drain electrodes 117 are connected to the drain electrode doping areas via a plurality of drain electrode through-holes 121. A plurality of pixel electrode through-holes 118 are formed in the organic layer 104, the dielectric layer 109, and the passivation layer 112. The pixel electrodes 108 are connected to the drain electrodes 117 via the pixel electrode through-holes 118.

The piezoelectric material, used for the pressure sensitive plates 105, refers to a crystalline material, which under pressure, will generate a voltage at two side surfaces. The piezoelectric material can generate an electric field in response to mechanical deformation, and can cause mechanical deformation in response to an electric field. If a pressure is exerted on the piezoelectric material, a potential difference would be produced (i.e., the direct piezoelectric effect). On the other hand, if a voltage is applied thereto, a mechanical stress would be produced (i.e., the converse piezoelectric effect). Once a finger presses the outer protective glass of the display, the display panel is deformed, and thus the pressure sensitive plates 105 are deformed. An electrical signal is generated in the direction where the panel is under pressure. At the pressure sensing point which corresponds to the site on which the finger touches the panel, an electrical current is detected. The electrical current is input to an IC driver via the pressure sensing lines 107, making the corresponding location at the panel to execute corresponding functional feedback.

The common electrodes 106 formed from the metal layer and the pressure sensing lines 107 are insulated from each other in order to avoid signal cross-talking caused by converse piezoelectric effect originated from the pressure sensing platers 105 to the display image.

The pressure sensing lines 107 are connected to the pressure sensitive plates 105.

For example, the organic layer 104 includes a first planarization layer and a second planarization layer formed on a surface of the first planarization layer. The pressure sensitive plates 105 are disposed between the first planarization layer and the second planarization layer. A plurality of pressure sensitive through-holes 119 are formed in the second planarization layer, and the pressure sensitive plates 105 are connected to the pressure sensing lines 107 via the pressure sensitive through-holes 119.

Alternatively, the pressure sensitive plates 105 are formed on the upper surface of the organic layer 104. The pressure sensing lines 107 are connected to the pressure sensitive plates 105 by contacting therewith. With this configuration, the pressure sensitive plates 105 is closer to the protective cover plate of the panel, the detection of pressure would be more sensitive, and the step for producing through-holes in the process can be omitted.

Figure 2:
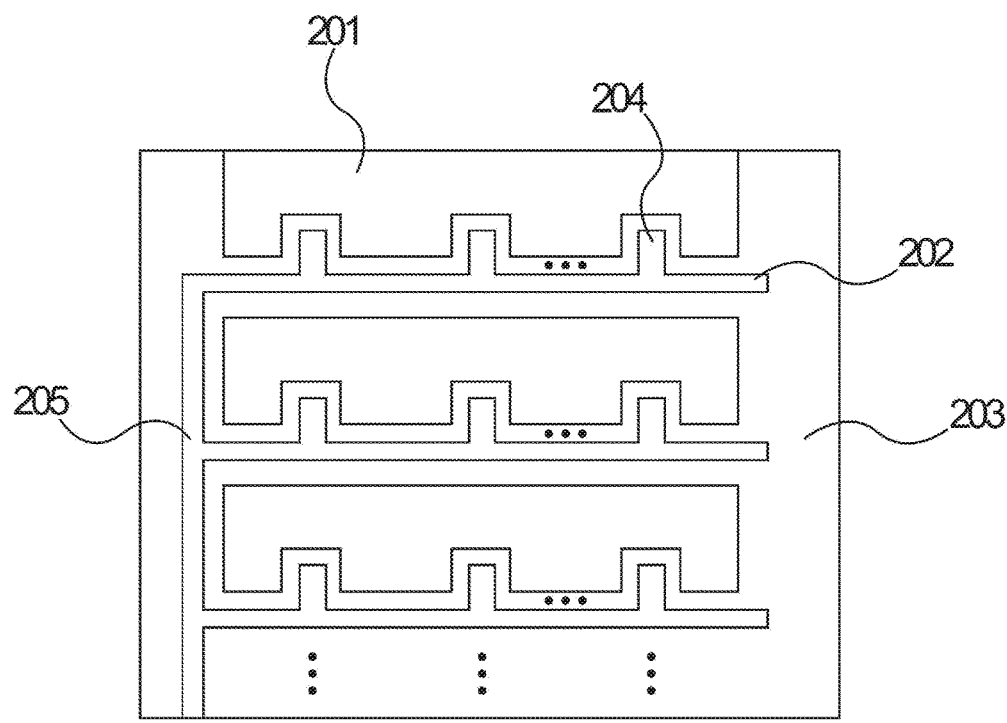
FIG. 2 shows a plan view of a pressure sensitive structure of an LTPS array substrate according to an embodiment of the present disclosure.

Please refer to FIG. 2. FIG. 2 shows a plan view of a pressure sensitive structure of an LTPS array substrate according to an embodiment of the present disclosure.

As shown in FIG. 2, a metal layer is formed on a surface of the pressure sensing plate 203. The metal layer includes the common electrodes 201 that are distributed separately.

One of the pressure sensing lines 202 is disposed between two adjacent common electrodes 201. The pressure sensing lines 202 are connected to a same signal line 205 at one end thereof. Therefore, even if one or some of the pressure sensing lines 202 are disconnected from the signal line, this would not significantly influence sensing of touch pressure, and thus permits large manufacturing tolerances.

A plurality of notches are formed at one side of each of the common electrodes 201. One pressure sensing point 204 is formed in each of the notch. The pressure sensing points 204 at the same row are connected to a same pressure sensing line 202. With one pressure sensing line connected plural pressure sensing point 204, sensing of a touched site can be more precise. In addition, by forming the pressure sensing point 204 within the common electrodes 201, the area that is occupied by the metal layer on surface of the organic layer can be reduced, which intensifies the arrangement density of the common electrodes 201 and the pressure sensing lines 202.

Please refer to FIGS. 3A-3M which shows the steps in a method for manufacturing the LTPS array substrate according to an embodiment of the present disclosure.

The method for manufacturing an LTPS array substrate according to the present disclosure includes the following steps.

Figure 3A:
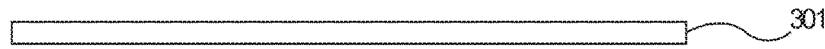
FIGS. 3A-3M shows the steps in a method for manufacturing the LTPS array substrate according to an embodiment of the present disclosure.

As shown in FIG. 3A, a substrate 301 is provided. Preferably, the substrate 301 is a transparent glass substrate 301.

Figure 3B:
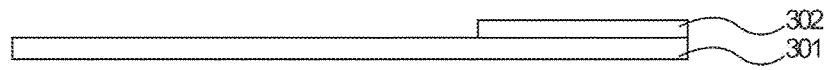

As shown in FIG. 3B, a light-shielding layer 302 is formed at the location corresponding to the thin-film transistors (TFTs). The light-shielding layer 302 can be made of aluminum-molybdenum alloy, chromium metal, molybdenum metal, or other conductive material with light-shielding function. The light-shielding layer 302 prevents occurrence of additional electrical current which is generated by illuminating light emitted from backlight unit on the channel layer.

Figure 3C:

As shown in FIG. 3C, a buffer layer 303 is formed on the substrate 301 to cover the light-shielding layer 302.

Figure 3D:

As shown in FIG. 3D, a polycrystalline silicon layer 304 is formed on the substrate 301, and ion implantation into the polycrystalline silicon layer 304 is performed to form a channel area as well as a source electrode doping area and a drain electrode doping area for each of the TFTs.

Figure 3E:
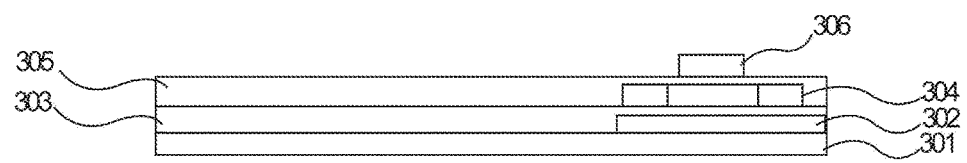

As shown in FIG. 3E, a gate electrode insulating layer 305 is formed on the substrate 301, and a plurality of gate electrodes 306 and a plurality of scan lines are formed on the gate electrode insulating layer 305.

Figure 3F:
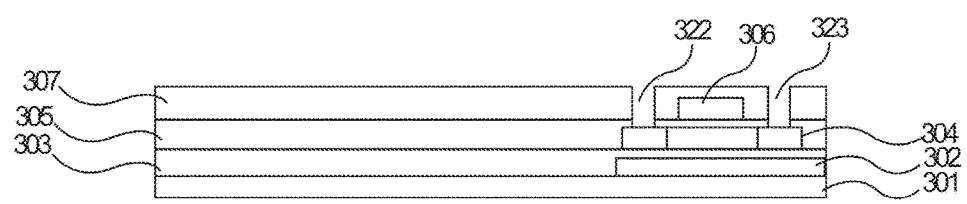

As shown in FIG. 3F, an interlayer insulating layer 307 is formed on the substrate 301, and a plurality of source electrode through-holes 323 and a plurality of drain electrode through-holes 322 are formed on the interlayer insulating layer 307.

Figure 3G:
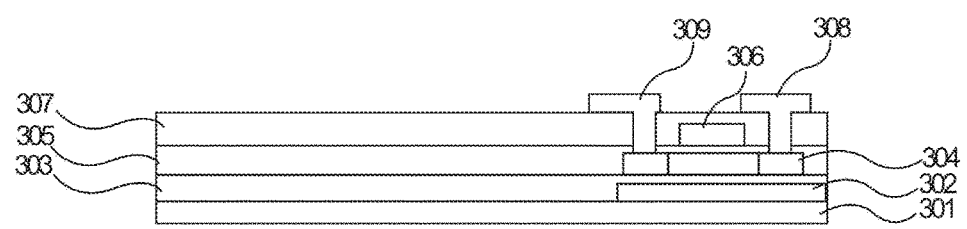

As shown in FIG. 3G, a first metal layer is deposited on the substrate 301, and the first metal layer is patterned to form a plurality of source electrodes 308 of the TFTs, a plurality of drain electrodes 309 of the TFTs, and a plurality of data lines. Each of the source electrodes 308 is connected to one side of one of the channels via one of the source electrode through-holes 323, and each of the drain electrodes 309 is connected to the other side of one of the channels via one of the drain electrode through-holes 322. Each of the source electrodes 308 of the TFTs is correspondingly connected to one of the data lines.

Figure 3H:
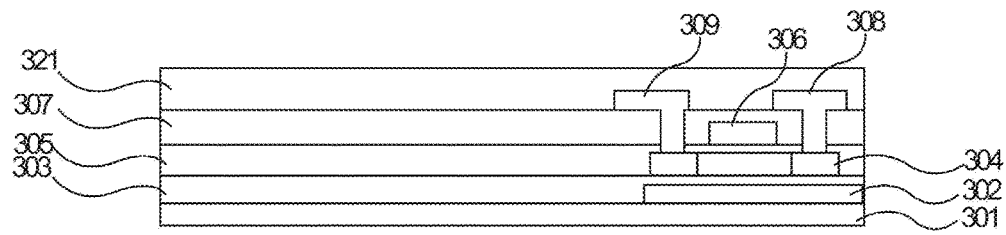

As shown in FIG. 3H, a first planarization layer 321 is deposited on the substrate 301.

Figure 3I:
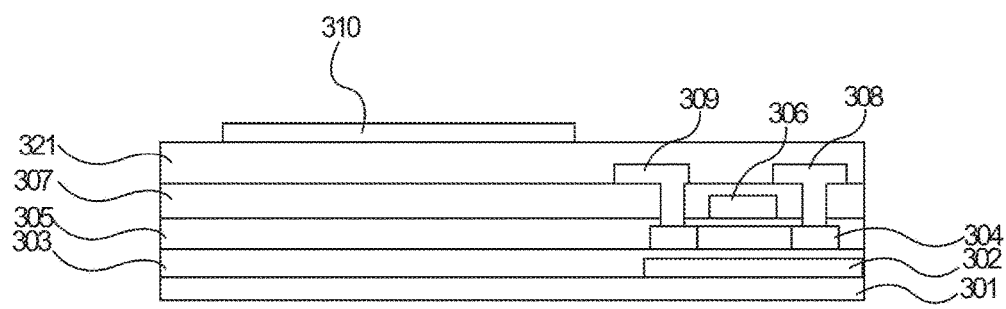

As shown in FIG. 3I, a plurality of pressure sensing plates are formed on the substrate 301.

Figure 3J:
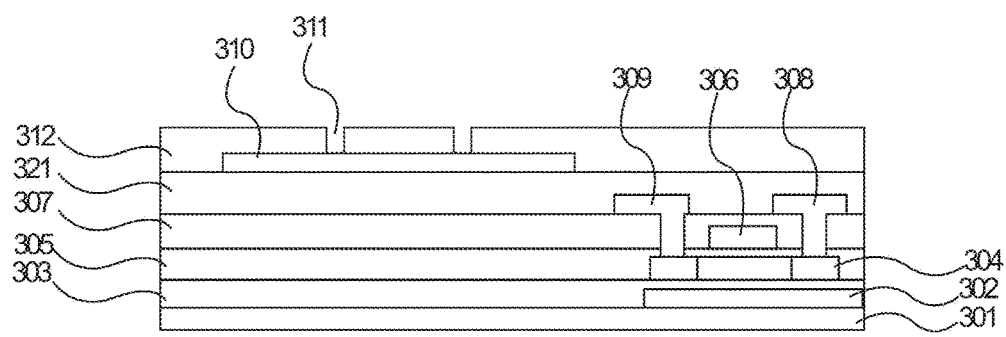

As shown in FIG. 3J, a second planarization layer 312 is deposited on the substrate 301, and a plurality of pressure sensitive through-holes 311 are formed on the pressure sensitive platers 310.

Figure 3K:
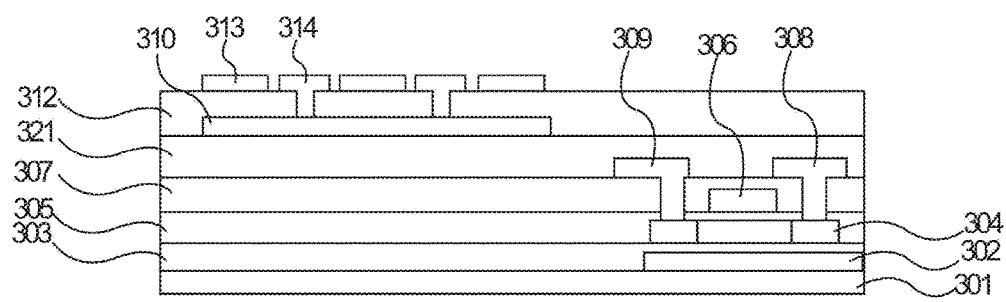

As shown in FIG. 3K, a second metal layer is deposited on the substrate 301, and the second metal layer is patterned to form a plurality of common electrodes 313 and a plurality of pressure sensing lines 314 that are insulated from each other on the second planarization layer 312. The pressure sensing lines 314 are connected to the pressure sensitive plates 310 via the pressure sensitive through-holes 311.

Figure 3L:
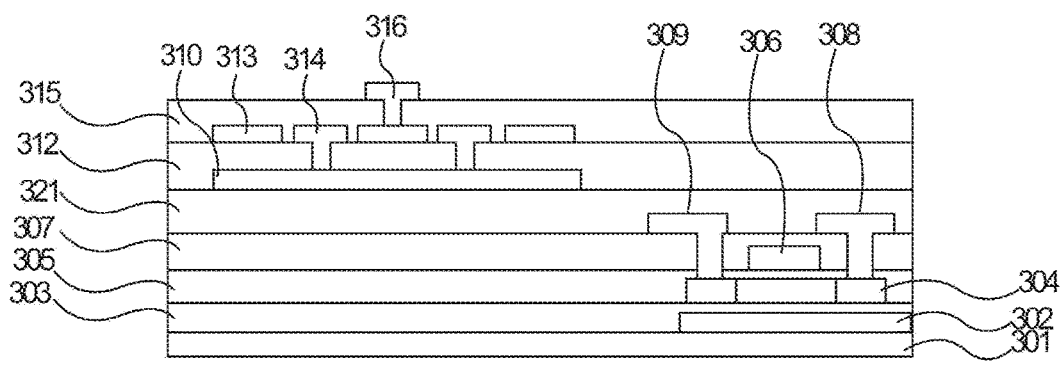

As shown in FIG. 3L, a dielectric layer 315 and a plurality of planar touch control signal lines 316 are formed on the substrate 301, and a plurality of touch control through-holes are formed on the dielectric layer 315. The planar touch control signal lines 316 are connected to the common electrode plates 313 via the touch control through-holes.

Figure 3M:
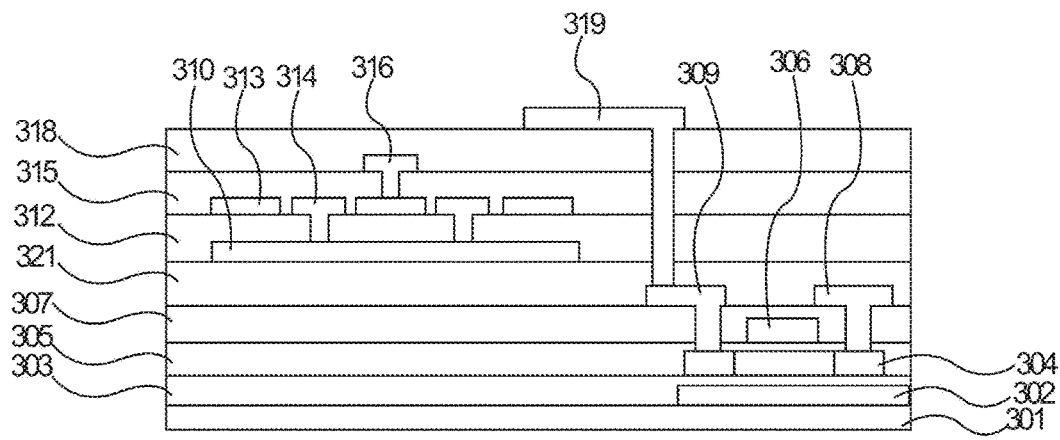

As shown in FIG. 3M, a passivation layer 318 and a plurality of pixel electrodes 319 are formed on the substrate 301, and a plurality of pixel electrode through-holes 320 are formed on the passivation layer 318, the dielectric layer 315, and the second planarization layer 312. The pixel electrodes 319 are connected to the drain electrodes 309 via the pixel electrode through-holes 320.

The LTPS array substrate 301 is thus formed, as shown in FIG. 3M.

Compared to conventionally-used display panel with touch pressure control function, the present disclosure provides an LTPS array substrate 301, where the pressure sensors are formed in the layered structure of the LTPS array substrate 301. This makes the distance between the pressure sensors and the cover glass smaller, which further not only raises sensitivity of touch pressure but reduces thickness of the display module. Additionally, according to present disclosure, the integrated pressure sensors can be formed in consistency with and compatibly with current manufacturing process. This would not require extra steps for manufacturing the panel. The problems encountered in the conventional touch pressure control display panel, including that add-on type of pressure sensors are far from the cover glass, sensitivity of touch pressure is low, and use of the add-on type of pressure sensors will increase both thickness and weight of the mobile apparatus, can be solved.

In summary, while the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A low temperature poly-silicon (LTPS) array substrate, comprising:
 a substrate;
 a gate electrode insulating layer formed on a surface of the substrate;
 an interlayer insulating layer formed on a surface of the gate electrode insulating layer;
 an organic layer formed on a surface of the interlayer insulating layer;
 a plurality of pressure sensitive plates formed in the organic layer, wherein the pressure sensitive plates are made of a piezoelectric material; and
 a metal layer formed on the organic layer, wherein the metal layer has a pattern of a plurality of common electrodes and a plurality of pressure sensing lines that are insulated from each other, and the pressure sensing lines are connected to the pressure sensitive plates;

wherein a plurality of notches are formed at one side of each of the common electrodes, one pressure sensing point is formed in each of the notches, and the pressure sensing points at a same row are connected to a same pressure sensing line.

2. The LTPS array substrate according to claim 1, wherein the metal layer comprises the common electrodes that are distributed separately, one of the pressure sensing lines is disposed between two adjacent common electrodes, and the pressure sensing lines are connected to a same signal line at one end thereof.

3. The LTPS array substrate according to claim 1, wherein a dielectric layer is formed on a surface of the organic layer, and a plurality of touch control through-holes are formed on the dielectric layer.

4. The LTPS array substrate according to claim 3, wherein a plurality of planar touch control signal lines are formed on a surface of the dielectric layer, and the planar touch control signal lines are connected to the common electrodes via the touch control through-holes.

5. The LTPS array substrate according to claim 1, wherein the organic layer comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates are connected to the pressure sensing lines via the pressure sensitive through-holes.

6. The LTPS array substrate according to claim 1, wherein the pressure sensitive plates are formed on a surface of the organic layer, the pressure sensing lines are formed on a surface of the pressure sensitive plates, and the pressure sensing lines are connected to the pressure sensitive plates by contacting therewith.

7. The LTPS array substrate according to claim 1, wherein both the common electrodes and the pressure sensing lines are a transparent metal electrode.

8. A low temperature poly-silicon (LTPS) array substrate, comprising:
a substrate;
a gate electrode insulating layer formed on a surface of the substrate;
an interlayer insulating layer formed on a surface of the gate electrode insulating layer;
an organic layer formed on a surface of the interlayer insulating layer;
a plurality of pressure sensitive plates formed in the organic layer, wherein the pressure sensitive plates are made of a piezoelectric material; and
a metal layer formed on the organic layer,
wherein the metal layer has a pattern of a plurality of common electrodes and a plurality of pressure sensing lines that are insulated from each other, and the pressure sensing lines are connected to the pressure sensitive plates.

9. The LTPS array substrate according to claim 8, wherein the metal layer comprises the common electrodes that are distributed separately, one of the pressure sensing lines is disposed between two adjacent common electrodes, and the pressure sensing lines are connected to a same signal line at one end thereof.

10. The LTPS array substrate according to claim 8, wherein a dielectric layer is formed on a surface of the organic layer, and a plurality of touch control through-holes are formed on the dielectric layer.

11. The LTPS array substrate according to claim 10, wherein a plurality of planar touch control signal lines are formed on a surface of the dielectric layer, and the planar touch control signal lines are connected to the common electrodes via the touch control through-holes.

12. The LIPS array substrate according to claim 8, wherein the organic layer comprises a first planarization layer and a second planarization layer formed on a surface of the first planarization layer, the pressure sensitive plates are disposed between the first planarization layer and the second planarization layer, a plurality of pressure sensitive through-holes are formed in the second planarization layer, and the pressure sensitive plates are connected to the pressure sensing lines via the pressure sensitive through-holes.

13. The LTPS array substrate according to claim 8, wherein the pressure sensitive plates are formed on a surface of the organic layer, the pressure sensing lines are formed on a surface of the pressure sensitive plates, and the pressure sensing lines are connected to the pressure sensitive plates by contacting therewith.

14. The LTPS array substrate according to claim 8, wherein both the common electrodes and the pressure sensing lines are a transparent metal electrode.

15. A method for manufacturing a low temperature poly-silicon (LTPS) array substrate, comprising:
providing a substrate;
forming a buffer layer on the substrate;
forming a channel for each of a plurality of TFTs;
forming a gate electrode insulating layer, a plurality of gate electrodes, and a plurality of scan lines on the substrate, wherein each of the gate electrodes is correspondingly connected to one of the scan lines;
forming an interlayer insulating layer on the substrate, and forming a plurality of source electrode through-holes and a plurality of drain electrode through-holes on the interlayer insulating layer;
depositing a first metal layer on the substrate, and patterning the first metal layer to form a plurality of source electrodes of the TFTs, a plurality of drain electrodes of the TFTs, and a plurality of data lines on the interlayer insulating layer; wherein each of the source electrodes is connected to one side of one of the channels via one of the source electrode through-holes, and each of the drain electrodes is connected to the other side of one of the channels via one of the drain electrode through-holes; wherein each of the source electrodes of the TFTs is correspondingly connected to one of the data lines;
forming an organic layer on the substrate, and forming a plurality of pressure sensitive plates in the organic layer, and then forming a plurality of pressure sensitive through-holes on the organic layer;
depositing a second metal layer on the substrate, and patterning the second metal layer to form a plurality of common electrodes and a plurality of pressure sensing lines that are insulated from each other on the organic layer; wherein the pressure sensing lines are connected to the pressure sensitive plates via the pressure sensitive through-holes;
forming a dielectric layer and a plurality planar touch control signal lines on the substrate, and forming a plurality of touch control through-holes on the dielectric layer; wherein the planar touch control signal lines are connected to the common electrodes via the touch control through-holes; and forming a passivation layer and a plurality of pixel electrodes on the substrate, and forming a plurality of pixel electrode through-holes on the passivation layer, the dielectric layer, and the organic layer; wherein the pixel electrodes are connected to the drain electrodes via the pixel electrode through-holes.

16. The method for manufacturing the LTPS array substrate according to claim 15, wherein forming an organic layer on the substrate, and forming a plurality of pressure sensitive plates in the organic layer, and then forming a plurality of pressure sensitive through-holes on the organic layer comprises:

forming a first planarization layer on the substrate, and forming the pressure sensitive plates on the first planarization layer;

forming a second planarization layer on the substrate, and forming the pressure sensitive through-holes on the second planarization layer.

* * * * *